(12) United States Patent
Stenz et al.

(10) Patent No.: US 8,082,532 B1
(45) Date of Patent: Dec. 20, 2011

(54) PLACING COMPLEX FUNCTION BLOCKS ON A PROGRAMMABLE INTEGRATED CIRCUIT

(75) Inventors: Guenter Stenz, Longmont, CO (US); Rajat Aggarwal, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 431 days.

(21) Appl. No.: 12/364,719

(22) Filed: Feb. 3, 2009

(51) Int. Cl.
*G06F 17/50* (2006.01)
(52) U.S. Cl. ........................................ 716/123
(58) Field of Classification Search ........... 716/118–125
See application file for complete search history.

(56) References Cited

U.S. PATENT DOCUMENTS

| | | | | |
|---|---|---|---|---|
| 7,392,499 | B1 * | 6/2008 | Stenz et al. ................. | 716/123 |
| 2002/0087939 | A1 * | 7/2002 | Greidinger et al. ............ | 716/2 |
| 2004/0103377 | A1 * | 5/2004 | Eaton et al. .................. | 716/1 |
| 2005/0108668 | A1 * | 5/2005 | Kabuo ........................ | 716/8 |

OTHER PUBLICATIONS

U.S. Appl. No. 11/787,812, filed Apr. 18, 2007, Stenz.
Frankle, Jon, "Iterative and Adaptive Slack Allocation for Performance-driven Layout and FPGA Routing," *29th ACM/IEEE Design Automation Conference*, Jun. 8-12, 1992, Paper 34.1, pp. 536-542, Anaheim, California, USA.
Kirkpatrick, S. et al., "Optimization by Simulated Annealing," *Science*, May 13, 1983, vol. 220, No. 4598, pp. 671-680.

* cited by examiner

*Primary Examiner* — Vuthe Siek
*Assistant Examiner* — Aric Lin
(74) *Attorney, Agent, or Firm* — Kevin T. Cuenot

(57) ABSTRACT

A computer-implemented method of implementing a circuit design within an integrated circuit (IC) can include, within an undirected graph representing the circuit design comprising nodes and edges, wherein each node represents a complex function block (CFB) or a pre-placed component of the circuit design and each edge represents at least one connection linking a pair of CFBs of the circuit design, determining an edge weight for each edge. The CFBs can be initially placed and a distance between each pair of CFBs joined by an edge of the undirected graph can be calculated. The CFB placement can be annealed by minimizing a cost function that calculates, for each edge, a product of the edge weight and the distance between the pair of CFBs joined by the edge. The cost function also can sum the products for each edge. The CFB placement can be stored.

20 Claims, 6 Drawing Sheets

PLACING COMPLEX FUNCTION BLOCKS ON A PROGRAMMABLE INTEGRATED CIRCUIT

FIELD OF THE INVENTION

The embodiments disclosed herein relate to integrated circuit devices (ICs). More particularly, the embodiments relate to placing components such as complex function blocks on programmable ICs.

BACKGROUND OF THE INVENTION

Placing a circuit design on a programmable integrated circuit (IC) refers to the process of assigning components of the circuit design to physical sites, or elements, of the programmable IC. The programmable IC includes a variety of different types of sites, e.g., look-up tables or flip-flops, that may be used to implement various components or combinations of components of the circuit design. For example, one or more logic gates that perform a particular function can be assigned to a particular look-up table (LUT) within a configurable logic block of the programmable IC. To implement the circuit design within the programmable IC, each component must be placed.

To better process the possibly hundreds of thousands of movable components of a circuit design, modern placement techniques utilize abstract models. Some placement techniques utilize a floating point coordinate system representing the programmable IC within which the circuit design will be implemented. Each site on the programmable IC has a particular coordinate in the floating point coordinate system. Components of the circuit design are initially assigned to locations on the programmable IC using the floating point coordinate system. The assigned location, however, may not coincide with available sites on the device. The component, for example, may be initially assigned a location that is between two available sites.

During placement, each component can be "snapped," or moved, to the nearest site that can accommodate the component being moved. In order for such a technique to yield acceptable results, an underlying assumption must hold true. The assumption is that a significant number of sites able to accommodate the component being moved are available and are nearby the current location of the component. The large number of LUTs and flip-flops in a programmable IC, being arranged in grid-like fashion, ensures that this is the case. While this assumption may hold true for components such as LUTs and flip-flops, it does not hold true for other more complex components referred to as complex function blocks (CFBs).

In general, CFBs refer to components such as block random access memories, digital signal processors, or the like. Typically, a programmable IC has significantly fewer sites for receiving CFBs, as compared to sites that may receive LUTs and flip-flops. For example, there may be only a single column of sites capable of receiving a CFB on the programmable IC, which violates the assumption that, given floating point coordinate, there will always be a nearby site of this type to which the component may be moved. The CFBs of the circuit design must be assigned to the limited number of CFB sites on the programmable IC. Accordingly, it is often the case that conventional placement techniques do not yield satisfactory results when placing CFBs due to the relative scarcity of CFB sites on the programmable IC.

SUMMARY OF THE INVENTION

The embodiments disclosed herein relate to placing complex function blocks (CFBs) on a programmable integrated circuit (IC). One embodiment of the present invention can include a computer-implemented method of implementing a circuit design within a programmable IC. The method can include, within an undirected graph representing the circuit design including nodes and edges, wherein each node represents a CFB or a pre-placed component of the circuit design and each edge represents at least one connection linking a pair of CFBs of the circuit design forming a CFB connection, determining an edge weight for each edge. The CFBs can be initially placed on the programmable IC and a distance between each pair of CFBs joined by an edge of the undirected graph can be calculated. The CFB placement can be annealed by minimizing a cost function that calculates, for each edge, a product of the edge weight and the distance between the pair of CFBs joined by the edge, and sums the products for each edge. The product for each edge further can be selectively adjusted according to an over budget term. The CFB placement can be stored.

For each CFB connection consisting of one connection, the method can include determining whether an estimated delay for the connection exceeds a budgeted delay for the connection. When the estimated delay exceeds the budgeted delay for the connection, the over budget term can be calculated for the CFB connection. The over budget term can depend upon a percentage by which the estimated delay for the connection exceeds the budgeted delay for the connection.

For each CFB connection including a plurality of connections, the method can include determining a target length for the CFB connection, determining whether a distance between the nodes joined by the CFB connection exceeds the target length, and, when the distance between the nodes exceeds the target length for the CFB connection, calculating the over budget term for the CFB connection. The over budget term can depend upon a percentage by which the distance between the nodes exceeds the target length.

Accordingly, for each edge, the method can include selecting a maximum one of the over budget terms for the edge and increasing the product for the edge by an amount proportional to the maximum over budget term.

For each CFB connection including a plurality of connections, the method can include translating a target delay for each connection of a CFB connection into a target length and summing the target length of each connection of the CFB connection to determine a target length for the CFB connection. Translating a target delay for each connection into a target length can include determining a maximum Manhattan distance for a connection that guarantees that the connection will not exceed a target delay for the connection.

The computer-implemented method also can include performing the initial placement of CFBs prior to placing look-up tables and flip-flops of the circuit design on the programmable IC.

Determining a weight for each edge can include, for each edge consisting of a single CFB connection, determining a net weight for each net connecting the pair of CFBs corresponding to the edge, selecting the net of the CFB connection having a minimum net weight, and determining an edge weight for the edge by calculating a product of the minimum net weight of the CFB connection and the inverse of the number of levels in the CFB connection.

Determining an edge weight for each edge can include, for each edge including a plurality of CFB connections, selecting the net having a minimum net weight for each CFB connection, for each CFB connection determining a product of the minimum net weight of the CFB connection and the inverse of the number of levels in the CFB connection, and summing the products to derive an edge weight for the edge.

Another embodiment of the present invention can include a computer-implemented method of implementing a circuit design within a programmable IC including determining an edge weight for each edge of the circuit design, wherein each edge represents at least one connection linking a pair of CFBs forming a CFB connection. Prior to placing configurable logic blocks and flip-flops of the circuit design, an initial placement of the CFBs can be performed. The CFB placement can be annealed by minimizing a cost function that calculates, for each edge, a product of the edge weight of the edge and a measure of distance between the pair of CFBs joined by the edge, and sums the products.

For each edge consisting of one connection, during the annealing, the method can include selectively applying a penalty by increasing the product for the edge according to estimated delay and budgeted delay of the connection. For each edge including at least two connections, during the annealing, selectively applying a penalty by increasing the product for the edge according to distance and target length of the connections. The CFB placement can be stored.

For each CFB connection consisting of one connection, the method can include determining whether an estimated delay for the CFB connection exceeds a budgeted delay for the CFB connection and, when the estimated delay exceeds the budgeted delay for the CFB connection, calculating an over budget term as the penalty. The over budget term can depend upon a percentage by which the estimated delay for the CFB connection exceeds the budgeted delay for the CFB connection.

For each CFB connection including a plurality of connections, the method can include determining whether a distance between the nodes joined by the CFB connection exceeds the target length and, when the distance between the nodes exceeds the target length for the CFB connection, calculating the over budget term as the penalty. The over budget term can depend upon a percentage by which the distance between the nodes exceeds the target length.

For each edge, the method can include selecting a maximum one of the over budget terms for the edge and increasing the product for the edge by an amount proportional to the maximum over budget term.

Another embodiment of the present invention can include a computer program product including a computer-usable medium having computer-usable program code that implements a circuit design for a programmable IC. The computer-usable medium can include computer-usable program code that, within an undirected graph representing the circuit design including nodes and edges, wherein each node represents a CFB or a pre-placed component of the circuit design and each edge represents at least one connection linking a pair of CFBs of the circuit design forming a CFB connection, determines an edge weight for each edge.

The computer-usable medium can include computer-usable program code that initially places the CFBs on the programmable IC, computer-usable program code that calculates a distance between each pair of CFBs joined by an edge of the undirected graph, and computer-usable program code that anneals the CFB placement by minimizing a cost function that calculates, for each edge, a product of the edge weight and the distance between the pair of CFBs joined by the edge, and sums the products. The product for each edge can be selectively adjusted according to an over budget term. The computer-usable medium also can include computer-usable program code that stores the CFB placement.

For each CFB connection consisting of one connection, the computer-usable medium can include computer-usable program code that determines whether an estimated delay for the CFB connection exceeds a budgeted delay for the CFB connection and computer-usable program code that, when the estimated delay exceeds the budgeted delay for the CFB connection, determines the over budget term for the CFB connection. The over budget term can depend upon a percentage by which the estimated delay for the CFB connection exceeds the budgeted delay for the CFB connection.

For each CFB connection including a plurality of connections, the computer-usable medium can include computer-usable program code that determines a target length for the CFB connection, computer-usable program code that determines whether a distance between the nodes joined by the CFB connection exceeds the target length and computer-usable program code that, when the distance between the nodes exceeds the target length for the CFB connection, determines the over budget term for the CFB connection. The over budget term can depend upon a percentage by which the distance between the nodes exceeds the target length.

For each edge, the computer-usable medium can include computer-usable program code that selects a maximum one of the over budget terms for the edge and computer-usable program code that increases the product for the edge by an amount proportional to the maximum over budget term.

For each CFB connection including a plurality of connections, the computer-usable medium can include computer-usable program code that translates a target delay for each connection of a CFB connection into a target length and computer-usable program code that sums the target length of each connection of the CFB connection to determine a target length for the CFB connection.

The computer-usable program code that determines a weight for each edge can include, for each edge consisting of a single CFB connection, computer-usable program code that determines a net weight for each net connecting the pair of CFBs corresponding to the edge, computer-usable program code that selects the net of the CFB connection having a minimum net weight, and computer-usable program code that determines an edge weight for the edge by calculating a product of the minimum net weight of the CFB connection and an inverse of the number of levels in the CFB connection.

The computer-usable program code that determines an edge weight for each edge can include, for each edge comprising a plurality of CFB connections, computer-usable program code that, for each CFB connection, selects the net having a minimum net weight, computer-usable program code that, for each CFB connection, determines a product of the minimum net weight of the CFB connection and an inverse of the number of levels of the CFB connection, and computer-usable program code that sums the products to derive an edge weight for the edge.

DETAILED DESCRIPTION

Figure 1:
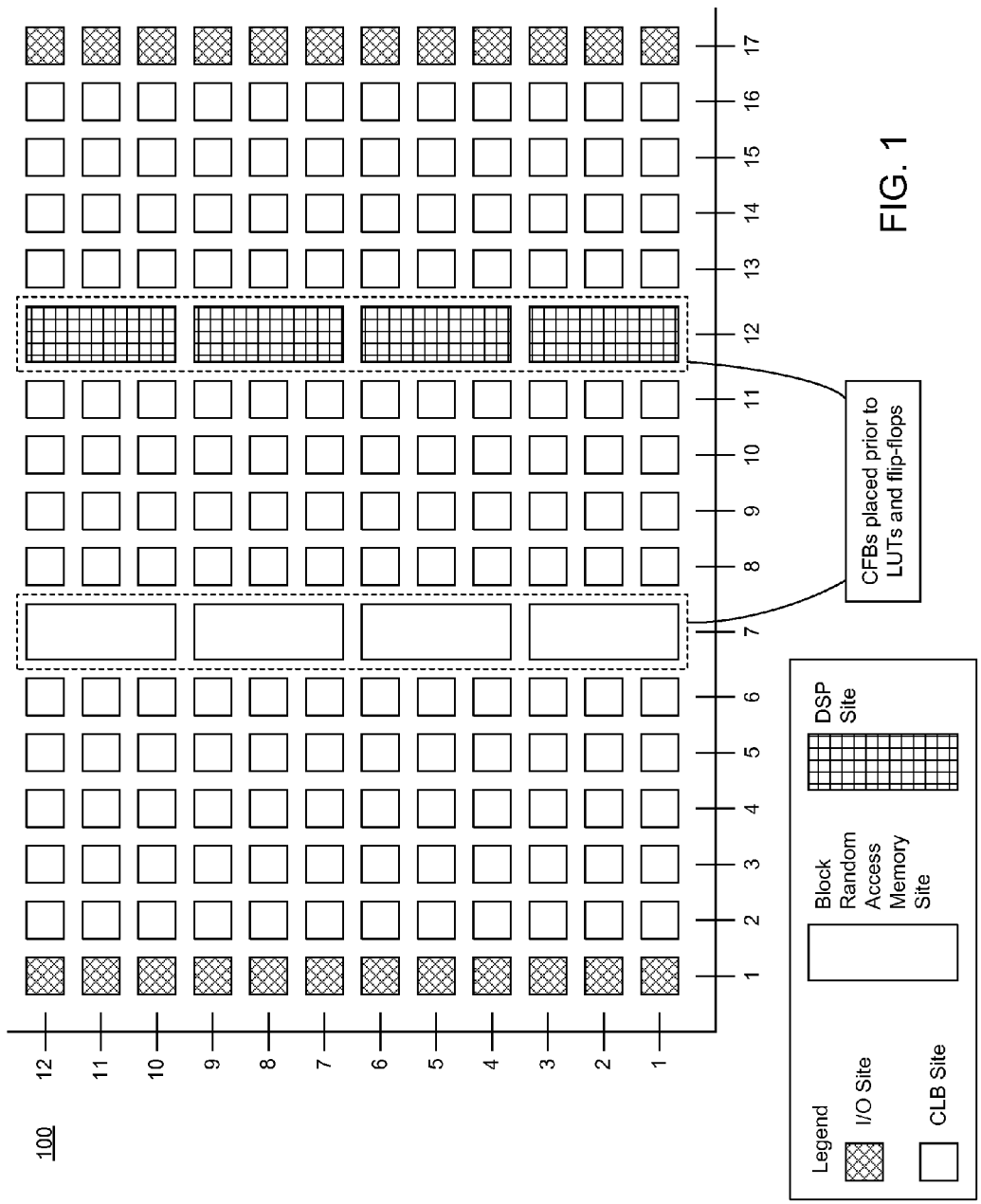
FIG. 1 is a first block diagram illustrating a field programmable gate array type of programmable integrated circuit (IC) in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to placing complex function blocks (CFBs) of a circuit design on a programmable integrated circuit (IC). In accordance with the embodiments disclosed herein, CFBs can be placed in a separate step than other components such as look-up tables (LUTs) or flip-flops. More particularly, the CFBs may be placed prior to the placement of LUTs and flip-flops. Since many components of the circuit design will not have been placed when CFBs of the circuit design are placed, the location of nodes of the circuit design that are disposed between pairs of CFBs will not be known. This complicates the evaluation of the placement of CFBs with respect to timing as predicting the timing of such signal paths, without placement information for these intervening nodes, can be unreliable.

In accordance with one embodiment of the present invention, distance can be used in lieu of timing. While the locations of any nodes of the circuit design, other than pre-placed nodes, that lie in the path between two connected CFBs will not be known, distances can be determined or estimated. Based upon established relationships between delay of a connection and the distance between the endpoints of the connection, a determination can be made as to whether the placement of CFBs is acceptable in terms of timing.

Programmable ICs are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), and CFBs such as dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from a memory (e.g., from an external PROM) or written into the FPGA by an external device. The collective states of the individual memory cells then determine the function of the FPGA.

Other types of programmable ICs can include Complex Programmable Logic Devices (CPLDs), Programmable Logic Arrays (PLAs), Programmable Array Logic (PAL) devices. For all of these types of programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other types of programmable ICs, referred to as mask programmable ICs, can be programmed by applying a processing layer, such as a metal layer, that programmably interconnects the various elements on the device. Programmable ICs can also be implemented in other ways, e.g., using fuse or antifuse technology. The phrase "programmable IC" can include, but is not limited to, these exemplary devices, as well as encompassing devices that are only partially programmable. For example, another type of programmable IC includes a combination of hard-coded transistor logic and a programmable switch fabric that programmably interconnects the hard-coded transistor logic.

FIG. 1 is a first block diagram illustrating an FPGA 100 in accordance with one embodiment of the present invention. FPGA 100 is illustrated in conjunction with an (x, y) coordinate system. As shown, FPGA 100 includes a plurality of programmable tiles arranged in a grid-like fashion within the (x, y) coordinate system. FPGA 100 includes a variety of different types of sites, each being referenced by an (x, y) coordinate pair. For ease of illustration, the different varieties of sites are arranged in columns. Those skilled in the art will appreciate that different FPGAs may have additional types of sites, more sites, fewer sites, or a different arrangement of sites.

Within this specification, the terms "site" and "block" may be used interchangeably from time to time. In general, a site refers to a location on the programmable IC, e.g., a particular programmable element, that can be assigned, e.g., programmed with, a particular type of block. For example, a particular site can be assigned CLBs, while other sites can be assigned a CFB such as a BRAM or a DSP block. In this respect, a selected site, having been assigned a CLB, may be referred to as a CLB.

The coordinate system shown in FIG. 1 can be used to calculate distance between sites on FPGA 100. For example, a Manhattan distance may be calculated and used as a measure of distance between two sites or components as the case may be. As used herein, the distance between two nodes of the circuit design having been assigned, e.g., placed, to sites on the programmable IC, may also be referred to as a length in reference to the length of the connection or wiring needed to connect the two nodes.

As pictured in FIG. 1, each site having an x-coordinate of 1 or 17 corresponds to a site for an I/O block. Any site having an x-coordinate of 2, 3, 4, 5, 6, 8, 9, 10, 11, 13, 14, 15, or 16 corresponds to a site for a CLB. Any site having an x-coordinate of 7 corresponds to a site for a BRAM. Any site having an x-coordinate of 12 corresponds to a site for a DSP block.

As noted, DSP blocks and BRAMs, as used herein, can be referred to as CFBs. As shown, FPGA 100 includes fewer CFBs than CLBs. FIG. 1 also illustrates that in many cases, the size of a CFB will be larger than a CLB. For example, a CFB may have a width and/or a length that is 2 times, 3 times, etc., larger than that of a CLB. In other cases, the length and/or width may simply be larger than a CLB, but less than twice that of a CLB.

In general, CLBs are spread out on FPGA 100 in grid-like fashion. For example, the Virtex-5 FPGA, which is commercially available from Xilinx, Inc. of San Jose, Calif., has an architecture in which CLBs are distributed similar to the manner pictured in FIG. 1. Those skilled in the art will appreciate, however, that any of a variety of programmable ICs may be used and that the principles described within this specification can be applied to such devices. Thus, while an FPGA is used from time-to-time within this specification as an example of a programmable IC, the embodiments described within this specification are not to be construed as being limited to one particular type of programmable IC.

As illustrated within FIG. 1, the CFBs can be placed in a different placement step than other components such as LUTs and/or flip-flops. For example, selected components such as I/O blocks may be placed first. One or more additional components, referred to as "pre-placed" components, of the circuit design may also be placed with the I/O blocks. Pre-placed components can be manually placed, for example, by a circuit designer. CFBs can be placed next, followed by LUTs and flip-flops.

Figure 2:
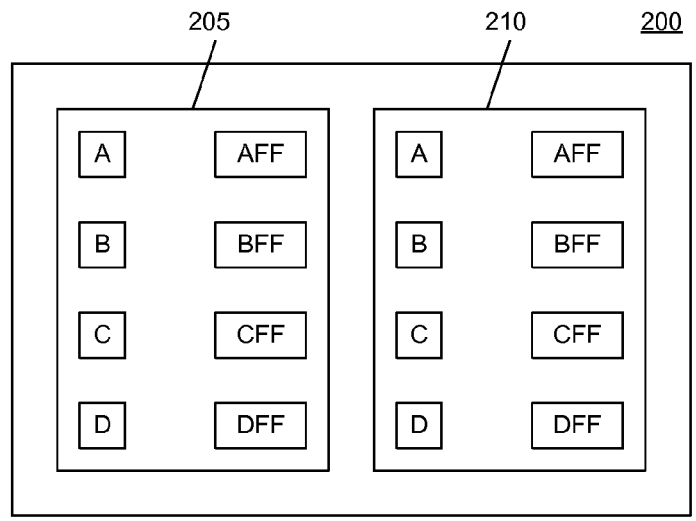
FIG. 2 is a second block diagram illustrating a configuration logic block of a programmable IC which is useful for understanding embodiments of the present invention.

FIG. 2 is a second block diagram illustrating a CLB 200 of a programmable IC which is useful for understanding embodiments of the present invention. As shown, CLB 200 can include two slices 205 and 210. Slices may also be generically referred to as "slice 0" and "slice 1" within each CLB. Each slice 205 and 210 can include four LUTs labeled A, B, C, and D, as well as four flip-flops labeled AFF, BFF, CFF, and DFF. It should be appreciated that CLB 200 is shown for purposes of illustration only and that the embodiments disclosed herein can be applied in cases where other varieties or structures of CLBs or other functional elements of a programmable IC are used.

Within a typical FPGA, the LUTs and flip-flops often number into the hundreds of thousands. The coordinate system illustrated in FIG. 1 can be extended to the intra-CLB level. That is, within each CLB, the LUTs and flip-flops are arranged on a rectangular grid such that a floating point x-coordinate and y-coordinate can be used to reference a given site, e.g., AFF, BFF, CFF, DFF, A, B, C, or D, of either of slice 205 or 210 for any CLB.

The large number of CLBs within a programmable IC leads to a higher probability that a given LUT or flip-flop will have another such site either to the immediate left or right, immediately above or below, or within a predetermined minimum distance left, right, above, below, or diagonally adjacent to the current location of the LUT or flip-flop. By comparison, CFBs are fewer in number and are arranged in single columns. No CFB has another CFB to its immediate right or left, e.g., in the next column or a distance of one tile to the left or right. While a LUT or a flip-flop will routinely be in close proximity to another site for a LUT or flip-flop, this is not the case with CFBs. Moving a CFB to another site usually entails moving the CFB a significant distance across the programmable IC as opposed to moving to a site that is only one tile away from the current site or another site within a same CLB as the current site.

Due to the more limited number of available sites in which to place CFBs and their arrangement in a sparse irregular grid, it can be advantageous to place CFBs in a separate placement step than the step in which the LUTs and the flip-flops are placed. As noted, CFBs can be placed prior to LUTs and flip-flops of a circuit design.

From FIG. 2, it can be seen that the delay of a connection having a component within CLB 200 as an endpoint and another endpoint external to CLB 200 will vary according to which LUT or flip-flop serves as the endpoint. Such is the case as the electrical characteristics of a flip-flop and a LUT may differ as well as the fact that the distance from the particular flip-flop or LUT that is selected as the endpoint of the connection to the other endpoint of the connection will be different for each respective LUT A, B, C, or D, and flip-flop AFF, BFF, CFF, or DFF. Further, the delay and/or distance will differ according to which slice, e.g., slice 205 or slice 210, includes the endpoint. In other words, a connection starting from a flip-flop will have a different delay depending upon whether the connection begins from AFF of slice 0, BFF of slice 0, AFF of slice 1, or BFF of slice 1, etc., of CLB 200.

Figure 3:
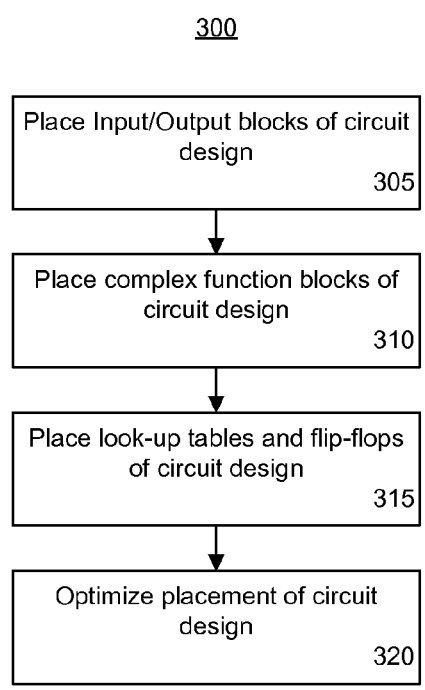
FIG. 3 is a first flow chart illustrating a method of placing a circuit design for implementation on a programmable IC in accordance with another embodiment of the present invention.

FIG. 3 is a first flow chart illustrating a method 300 of placing a circuit design for a programmable IC in accordance with another embodiment of the present invention. Method 300 illustrates a high level method for placing a programmable IC and can begin in a state where one or more components of the circuit design may have been pre-placed, e.g., manually placed, by a circuit designer. In step 305, any I/O blocks which have not been pre-placed can be placed on the programmable IC. In step 310, CFBs of the circuit design can be placed on the programmable IC. After placement of the CFBs, LUTs and flip-flops of the circuit design, which have not already been pre-placed, can be placed on the programmable IC in step 315. During step 315, CFBs can be treated as pre-placed and may be locked, or prohibited from being moved or relocated. In step 320, the placement of the circuit design can be optimized using any of a variety of different optimization techniques such as swapping or moving individual LUTs, flip-flops, or CFBs.

Typically, circuit designs are represented as directed graphs with nodes representing components and edges representing the connections between the nodes. Accordingly, a "connection" refers to a pin-to-pin connection or link within the full circuit design or netlist. In one embodiment, the circuit design to be placed on the programmable IC can be represented as a CFB graph, also denoted as G(N,E), which can be an undirected graph formed of a set of nodes N and a set of edges E.

The set of nodes N can be defined as N={$N_i$}, which includes one node corresponding to each CFB component and one node corresponding to each pre-placed component of the circuit design. As CFBs are to be placed prior to LUTs and flip-flops, any components that have been manually placed by the circuit designer prior to the placement of the CFBs will be included in the set of nodes representing CFBs of the CFB graph. Throughout this specification, the term "node," in reference to nodes of a graph representing the circuit design or some portion of the circuit design, and the term "component," in reference to components of the circuit design, may be used interchangeably as nodes generally represent components.

The phrase "CFB connection" can refer to an undirected path linking a CFB with a pre-placed component of the CFB graph or an undirected path linking two CFBs of the CFB graph. As such, a CFB connection can include one or more connections. Each edge of the CFB graph can represent one or more CFB connections between two CFBs. An edge $e_i$ can be represented by the pair of nodes that are linked or coupled by that edge. Accordingly, an edge can be denoted as $e_i=(N_k,N_l)$. As the CFB graph includes a reduced set of components and connections, as compared to the full netlist for the circuit design, the CFB graph can be viewed as a consolidated and undirected version of the directed graph typically used to represent the entire circuit design, e.g., the full netlist.

Each edge $e_i$ further can be assigned, or associated with, a weight $w_i$. In general, the higher the connectivity of the two nodes joined by the edge, the greater the weight of the edge. The more paths that exist between two nodes joined by an edge and the fewer the number of logic levels, e.g., intervening placed or unplaced components in the path between the two nodes, the higher the connectivity between the two nodes and the greater the weight of the edge linking the two nodes. The connectivity between each pair of nodes can be calculated without regard to the directionality of signals flowing between the nodes. For this reason, the CFB graph is undirected as connectivity is viewed, as will be demonstrated, without regard for the direction in which signals flow between the nodes.

Figure 4:
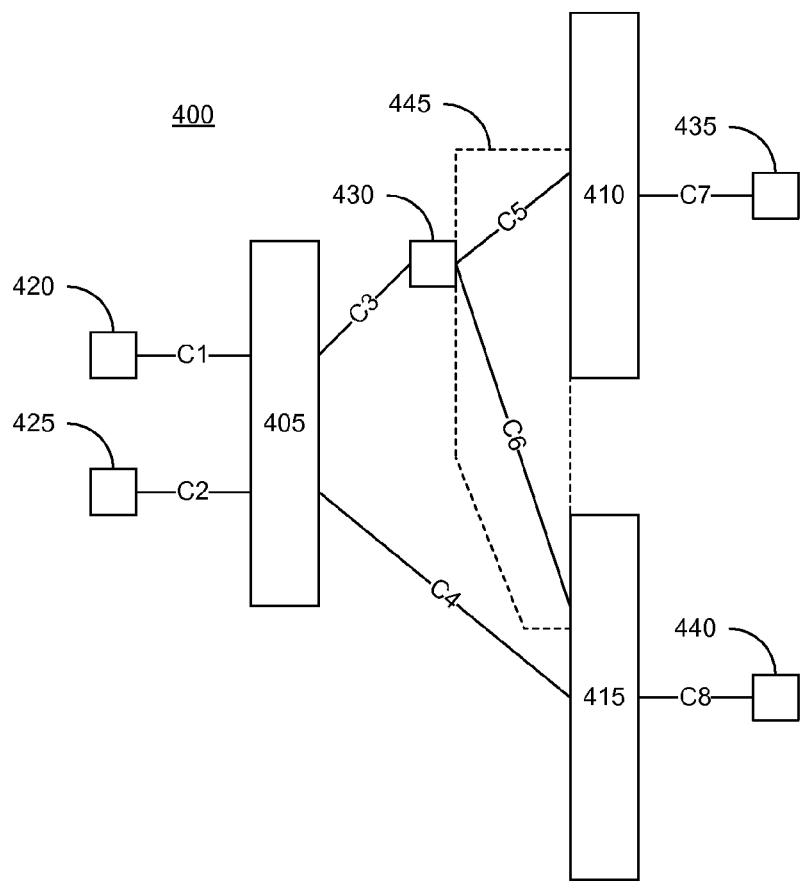
FIG. 4 is a third block diagram illustrating a graph of a netlist for a circuit design to be implemented within a programmable IC in accordance with another embodiment of the present invention.

FIG. 4 is a third block diagram illustrating a graph 400 of a netlist for a circuit design to be implemented within a programmable IC in accordance with another embodiment of the present invention. Graph 400 represents a full netlist and is useful for illustrating the manner in which edges and corresponding edge weights can be determined for a CFB graph. Those skilled in the art will appreciate that graph 400 is presented for purposes of illustration only and that an actual graph for a circuit design will likely include many more nodes.

As pictured, graph 400 includes three CFBs represented by nodes 405, 410, and 415. Graph 400 also includes five additional nodes 420, 425, 430, 435, and 440, which may be I/O blocks, LUTs, flip-flops, or the like. The nodes of graph 400 are linked by connections C1, C2, C3, C4, C5, C6, C7, and C8.

In one embodiment, edge weight can depend upon a measure of net weight. For example, a measure of net weight such as 2/n, where n represents the number of pins in the net, may be used. This definition of net weight results in nets with fewer pins inducing higher connectivity between the driver and the load nodes connected by the net, e.g., a larger weight, than would nets with a higher number pins.

In determining edges and edge weights for the CFB graph, a wave front can be started from component $N_i$, implementing a breadth first search and encounter component $N_j$ after traversing a sequence of k connections, e.g., pin-to-pin connections, $\{C_{i1}, \ldots, S_{ik}\}$ where these connections belong to nets $\{S_{i1}, \ldots, S_{ik}\}$. The sequence of connections $\{C_{i1}, \ldots, C_{ik}\}$ can be referred to as a CFB connection $P_i$. The breadth first search can be performed without regard to signal flow direction as the connectivity between CFBs is desired even under conditions where no signal flows along the connection.

As an example, consider the case of two CFBs that drive a common flip-flop. The CFBs are not directly connected to one another, e.g., the CFBs do not communicate with one another. It is advantageous to locate the two CFBs closer to one another in view of the fact that each drives a same load. In this case, the two CFBs can be said to be connected, e.g., form CFB connection, through two levels. Each level corresponds to a "hop" or a pin-to-pin connection in the full netlist. Thus, the two CFBs can be said to be connected by two levels despite the fact that neither CFB communicates with the other.

The connection having the minimum weight, denoted as $w_{min}$, of the k nets $\{S_{i1}, \ldots, S_{ik}\}$ forming the CFB connection $P_i$ can be selected. This CFB connection will induce an edge between the nodes $N_i$ and $N_j$ and will contribute a weight of $w_{min}/k$ to this edge. In other words, weight contribution of a CFB connection to an edge will be higher the fewer logic levels that exist between the two connected CFBs and the fewer the number of pins that exist within the nets along the CFB connection. Any other CFB connections $P_i$ between the two nodes $N_i$ and $N_j$ will contribute corresponding weights to the same edge in the CFB graph. By performing a breadth-first-search in this manner from all CFBs in the circuit design, the connectivity between the CFBs can be determined as well as the edge weights in the CFB graph.

In another embodiment, to reduce the amount of computation performed, a threshold t can be defined as an upper limit for the number of logic levels, or hops, traversed during the breadth-first-search. In such an embodiment, CFB connections involving more than t connections will not be considered when calculating the edge weights. Typical examples of the value of t may be 4, 5, or 6. It should be appreciated that the value of t may be smaller than 4 or larger than 6 and may depend upon the availability of computational resources and the amount of time available to the circuit designer for performing calculations. Other factors, such as the type of the programmable IC upon which the circuit design will be implemented and the size of the circuit design, also may influence the selection of t.

Returning to FIG. 4, each of connections C1, C2, C3, C4, C7, and C8 constitutes a single net that includes two pins. Thus, calculating a net weight for each connection using the 2/n net weight definition results in a net weight of 1 for each of connections C1, C2, C3, C4, C7, and C8. Net 445, formed of connections C5 and C6, includes 3 pins, resulting in a net weight of 2/3.

Figure 5:
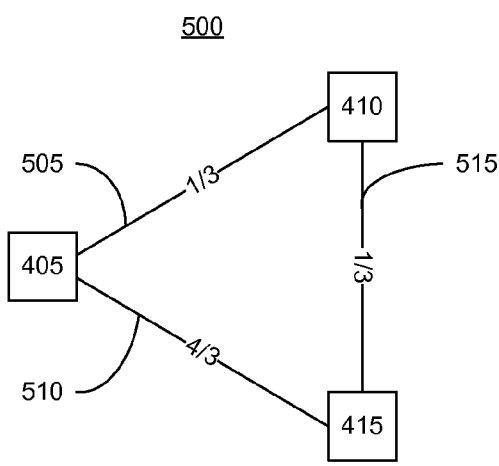
FIG. 5 is a fourth block diagram illustrating a complex function block (CFB) graph derived from the graph illustrated in FIG. 4 in accordance with another embodiment of the present invention.

FIG. 5 is a fourth block diagram illustrating a CFB graph 500 derived from the graph illustrated in FIG. 4 in accordance with another embodiment of the present invention. As shown, any components that are not CFBs or pre-placed components have been excluded from CFB graph 500. In this example, each node is a CFB. Thus, only nodes 405, 410, and 415 are included in CFB graph 500. Connectivity between nodes 405, 410, and 415 is illustrated with edges 505, 510, and 515. The weight of each edge is also shown.

As pictured, edge 505 has a weight of 1/3. In reviewing graph 400 of FIG. 4, it can be seen that a CFB connection exists between node 405 and node 410 which includes connection C3 and C5. Connection C3 has a net weight of 1. Net 445, which includes connection C5, has a net weight of 2/3 corresponding to the weight of the entire net weight for net 445. The net having the smallest net weight can be selected, in this case net 445 having a net weight of 2/3. The selected net weight is then divided by the number of logic levels separating the two nodes being evaluated for connectivity, e.g., nodes 405 and 410. From graph 400 of FIG. 4, node 405 and node 410 are separated by two levels, e.g., two connections being C3 and C5. Accordingly, the selected net weight of 2/3 can be divided by 2, which yields an edge weight of 1/3 for edge 505.

Edge 510 has an edge weight of 4/3. From graph 400, it can be seen that node 405 and node 415 are joined by two CFB connections. The first CFB connection is formed exclusively of the net of connection C4. The second CFB connection is formed of connection C3 and connection C6. Each CFB connection is handled separately, with the results being summed to obtain the edge weight for edge 510.

Taking connection C4 first, the net weight of connection C4 is 1. Since only one connection separates nodes 405 and 415, the selected net weight is that of connection C4, e.g., 1. The number of levels separating node 405 from node 415 through the CFB connection formed by connection C4 is 1. Dividing the net weight 1 by the number of levels, which is also 1, yields a value of 1. Accordingly, the contribution to edge weight of edge 510 by this CFB connection is 1.

Considering the CFB connection formed of connections C3 and C6, the net weight of connection C3 is 1. The net weight of connection C6, being part of net 445, is ⅔. Since there are two net weights to be considered for this CFB connection, the net with the smallest net weight is selected, in this case net 445 having a net weight of ⅔. The number of levels along this CFB connection that must be traversed in moving from node 405 to node 415 is two, e.g., connections C3 and C6. Accordingly, the selected net weight of ⅔ can be divided by 2, resulting in a contribution to the edge weight of edge 510 of ⅓ for this CFB connection. The edge weights in this example have been computed using a value of 2 for the threshold t. That is, a maximum number of two logic levels within the full netlist were traversed to find the connectivity between CFBs.

After considering each CFB connection between node 405 and node 415 separately, the two contributions can be summed to produce an edge weight for edge 510. The sum of 1, from the CFB connection including the net of connection C4, and ⅓, from the CFB connection including connections C3 and C6, results in an edge weight of 4/3 for edge 510.

Edge 515 has a weight of ⅓. In reviewing graph 400 of FIG. 4, it can be seen that only one CFB connection exists between node 510 and node 515. That CFB connection travels through net 445, comprising connections C5 and C6. As noted, net 445 has a net weight of ⅔. Since no other nets are used in linking nodes 410 and 415, the net weight of net 445 can be the selected net weight, e.g., the smallest net weight. The number of levels existing between nodes 410 and 415 is two, corresponding to connections C5 and C6. Dividing the net weight of ⅔ by 2 results in an edge weight of ⅓ for edge 515.

Figure 6:
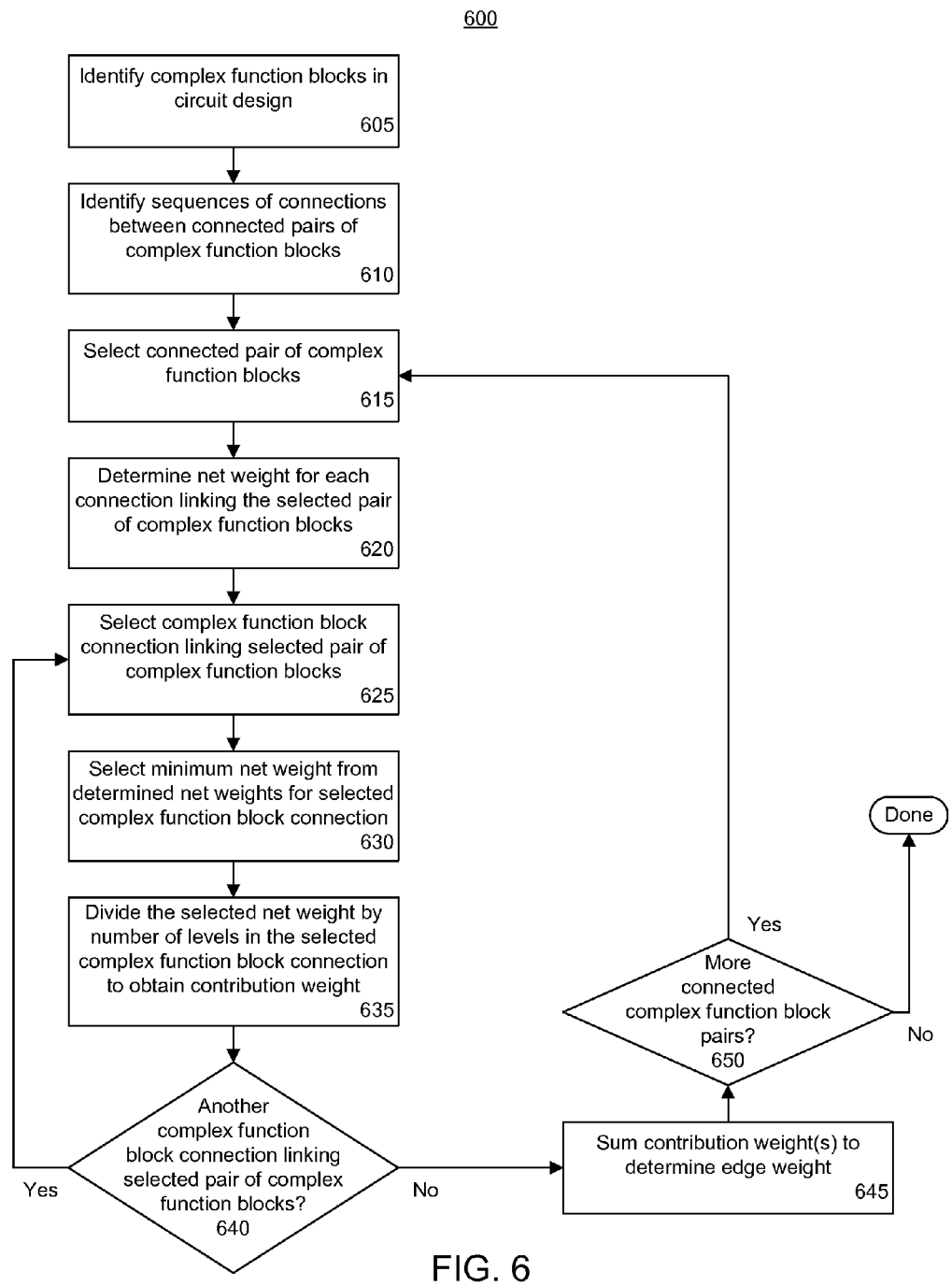
FIG. 6 is a second flow chart illustrating a method of determining edges and edge weights for a CFB graph in accordance with another embodiment of the present invention.

FIG. 6 is a second flow chart illustrating a method 600 of determining edges and edge weights for a CFB graph in accordance with another embodiment of the present invention. Method 600 can begin in step 605 where CFBs of the circuit design to be placed on the programmable IC can be identified. As noted, the CFBs can be identified from an analysis of the entire netlist or other programmatic representation of the entire circuit design. In step 610, sequences, each including one or more connections linking a pair of CFBs, can be determined. The sequences of connections also may be determined from the programmatic representation of the entire circuit design, e.g., the unplaced netlist. As noted, only CFB connections with fewer than t connections may be considered if so desired.

In step 615, a pair of CFBs connected by one or more connections can be selected. As noted, only CFBs connected by t or fewer connections, where t is an integer that is greater than zero, may be considered "connected." In step 620, a net weight for each net linking the selected pair of CFBs can be determined. In step 625, a set of connections forming a CFB connection linking the selected pair of CFBs can be selected. As illustrated with respect to FIG. 4, more than one CFB connection may exist that links the selected pair of CFBs. If only one CFB connection exists, that CFB connection may be selected.

In step 630, the minimum weight of all net weights determined for the selected CFB connection can be selected. In step 635, the selected net weight can be divided by the number of levels in the selected CFB connection. In the case where more than one CFB connection links the selected pair of CFBs, the result of dividing the selected net weight by the number of levels in the path can be considered a contribution weight, which will be added with each other contribution weight for each other CFB connection linking the selected pair of CFBs. If, however, only one CFB connection links the selected pair of CFBs, the contribution weight of the CFB connection can be considered the edge weight of the edge that links the selected pair of CFBs.

In step 640, a determination can be made as to whether another CFB connection exists that links the selected pair of CFBs. If so, the method can loop back to step 625 to process further CFB connection(s). If not, the method can proceed to step 645. In step 645, the contribution weight(s) can be summed to result in an edge weight for the selected CFB pair. As noted, if a single CFB connection exists that links the selected CFB pair, then the contribution weight determined for the CFB connection will be the edge weight.

In step 650, a determination can be made as to whether more connected pairs of CFBs exist. If more CFB pairs exist to be processed, the method can loop back to step 615. If not, the method can end.

In accordance with the embodiments disclosed within this specification, CFBs can be placed on the programmable IC utilizing a cost function that incorporates delay information and, in cases where delay information is not available, length or distance information. It becomes necessary, therefore, to translate delays for connections into lengths. For example, a target delay for a connection can be translated into a target distance. The target distance can be such that if the distance between endpoints of a given connection does not exceed the target distance, the estimated and/or actual delay of the connection is guaranteed to meet, e.g., not exceed, the target delay.

In general, the delay of a connection between a driver pin $p_1$ and a load pin $p_2$ will depend upon the horizontal offset between the two pins calculated using the x-coordinate of each pin and the vertical offset between the two pins calculated using the y-coordinate of each pin. The horizontal offset can be denoted as dx=x(load)−x(source). The vertical offset can be denoted as dy=y(load)−y(source).

The type of the driver pin $p_1$ and the load pin $p_2$ will also influence the delay of a connection, and therefore, the maximum allowable distance between the driver and load pins. As used herein, the type of a pin can specify the type of the component to which the driver pin $p_1$ or load pin $p_2$ belongs and the location of that component. The type of a pin further can specify which pin on a block that has multiple pins. For example, the type of a driver can be specified as LUT A within slice 0, or flip-flop AFF within slice 1. The type accounts for the fact that the delay of a connection will differ according to whether the driver pin $p_1$ is located within slice 0 or 1 of a CLB, whether the driver pin $p_1$ is assigned to a LUT or flip-flop and which LUT or flip-flop within the enumerated slice, as well as which specific pin on a component considered to be the driver.

The delay of two connections having the same dx, dy, and the same driver and load types, can be considered to be approximately equal, if not the same, across the programmable IC. The prefabricated and grid-like nature of the programmable IC, where CLBs are arranged in columns and rows, allows this presumption to hold.

A "signature" of a connection specifies the type of the driver pin $p_1$, the type of the load pin $p_2$. Thus, two connections having the same connection signature will have same driver pin types and same load pin types. Two connections of the same connection signature will have the same estimated and/or actual delay if the driver and load components have the same offset.

Using the above information, the target length for a given connection $C_i$, denoted as $l_{target}(C_i)$, can be determined to be the largest integer value of v, where v indicates Manhattan distance between the driver pin $p_1$ and the load pin $p_2$ so that the delay of the connection does not exceed the target delay $d_{target}(C_i)$. This can be expressed as $d_{max}[v'] \leq d_{target}(C_i)$ for all $v' \leq v$, where $d_{max}[v']$ denotes the maximum delay of the connection if the driver and load pins are a particular number of tiles, e.g., v', apart. In other words, the maximum distance between the driver pin $p_1$ and the load pin $p_2$ for a given connection should not exceed the target distance $l_{target}(C_i)$. This ensures that the timing of the connection will not be violated, presuming that the target distance was derived from the target delay.

Figure 7:
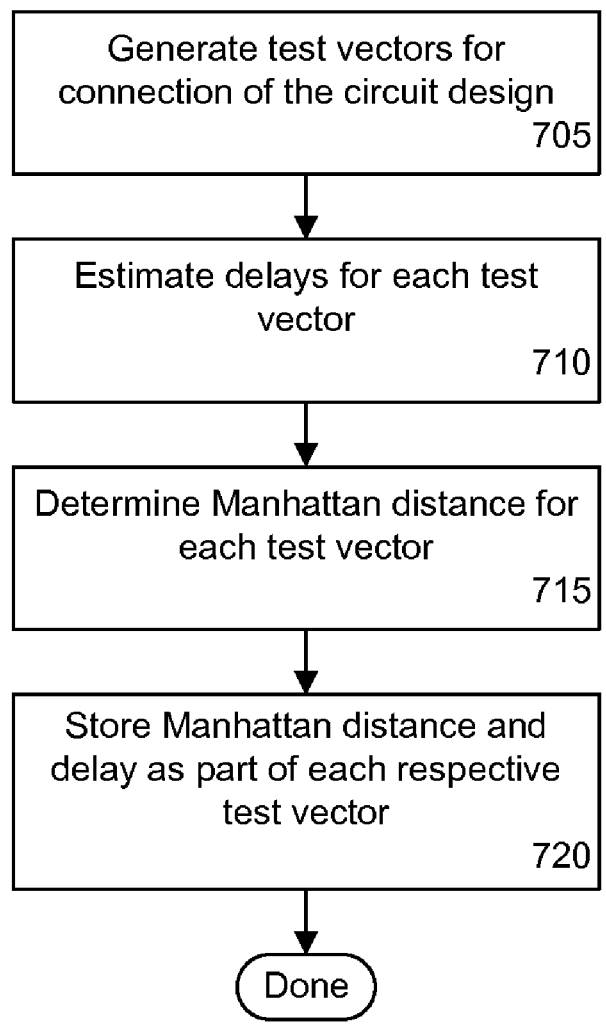
FIG. 7 is a third flow chart illustrating a method of determining a target length for a connection of a circuit design in accordance with another embodiment of the present invention.

FIG. 7 is a third flow chart illustrating a method 700 of determining a target length for a connection of a circuit design in accordance with another embodiment of the present invention. It should be appreciated that method 700 can be repeated as may be required to iterate through each connection of the circuit design. For connections having the same signature, however, repetition of method 700 is not required as the connections will have the same characteristics in terms of target length.

Method 700 can begin in a state where the circuit design to be placed has been mapped, such that the various components of the circuit design have been associated with, or assigned to, available functional elements and specific resource types of the target device. For example, logic gates have been mapped to LUTs and/or flip-flops of CLBs, etc. The circuit design, however, has not been placed. That is, although the components of the circuit design have been associated with physical structures of the programmable IC within which the circuit design will be implemented, those components have not yet been assigned to locations, or sites, on the physical device.

Accordingly, in step 705, one or more test vectors can be generated for a connection of the circuit design having a particular connection signature. A test vector refers to a pair of sites on the programmable IC in which the first site is a valid location for the driver of the connection and the second site is a valid location for the load of the connection. One test vector may be created for each possible offset of a load site relative to a driver site on the programmable IC. The test vectors, taken collectively, can define all possible driver site and load site combinations in terms of different types of sites and distances between the driver and load sites. For purposes of reducing computation time, the maximum distance, in terms of Manhattan distance measured in CLB tiles, separating pairs of sites for test vectors can be limited so that no test vectors having a distance exceeding some maximum threshold number of tiles will be generated.

In step 710, a delay estimation technique can be used to estimate the delay for each of the test vectors generated in step 705. The delay is estimated as if the driver and the load of the connection were located in the exact sites specified for each respective test vector. An estimated delay can be determined for each test vector as the programmable IC is prefabricated. It should be appreciated that the test vectors specify relative placements for each driver-load pair. The driver and load pins can be located in any available sites on the programmable IC that match the connection signature characteristics of the test vectors. In step 715, the Manhattan distance can be determined for each of the test vectors. In step 720, the estimated delay and the Manhattan distance can be stored as part of each respective test vector.

Accordingly, for each connection signature, a plurality of test vectors are available, where each test vector specifies a pair of available sites (relatively placed), a delay for the connection should the driver and source be placed at the sites, and a length for the connection should the driver and load be placed at the sites. This information can be used to provide delay and distance measures for the cost function calculation to be described in greater detail in FIG. 8.

It should be appreciated that as test vectors for connection signatures are calculated, such information need not be recalculated for another connection having a same connection signature. Presuming that the programmable IC within which the circuit design will be implemented is unchanging, the test vectors for a given connection signature can be reused from one circuit design to another. In this regard, the test vectors may be pre-calculated and stored rather than computed in real-time, e.g., just prior to calculation of the cost function or during calculation of the cost function, for various models or types of programmable ICs.

Further information regarding the manner in which test vectors can be created can be found within co-pending application Ser. No. 11/787,812, filed Apr. 18, 2007, which is assigned to Xilinx, Inc. of San Jose, Calif., and which is hereby incorporated into this specification by reference in its entirety.

Figure 8:
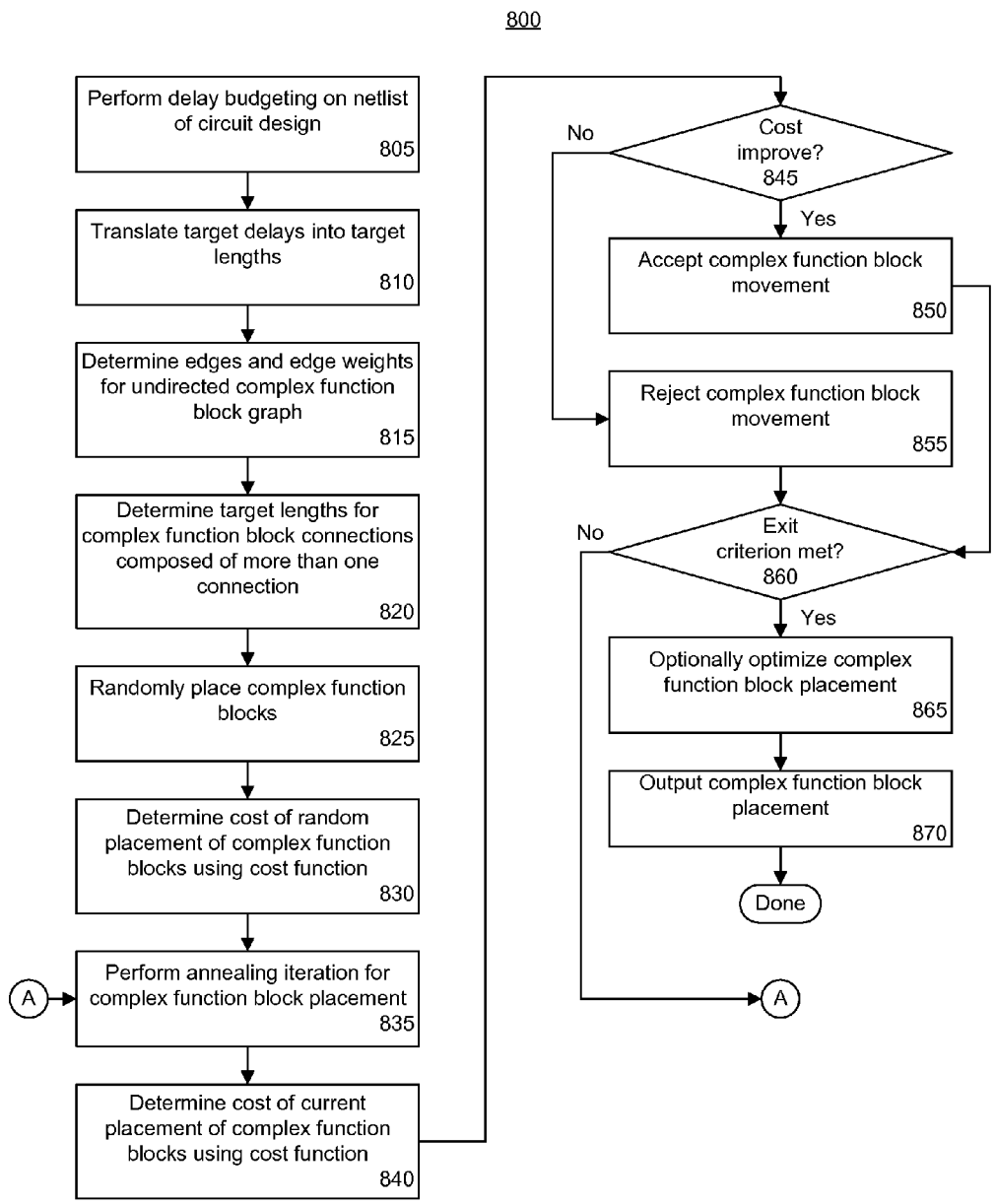
FIG. 8 is a fourth flow chart illustrating a method of placing CFBs in accordance with another embodiment of the present invention.

FIG. 8 is a flow chart illustrating a method 800 of placing CFBs in accordance with another embodiment of the present invention. Method 800 presents a more detailed technique for placing CFBs as initially described with reference to step 310 of FIG. 3. As such, method 800 provides a technique for placing CFBs that can be implemented after a designer has pre-placed selected components and prior to placement of LUTs and flip-flops. Method 800 can begin in step 805 where delay budgeting can be performed on the netlist or other programmatic representation of the entire circuit design to be placed.

Delay budgeting refers to a process where timing requirements for a circuit design can be evaluated and reduced to a series of target delays. A timing specification for the circuit design can be processed to yield a target delay for each pin-to-pin connection of the circuit design. If each connection is designed in a manner that does not exceed the target delay for that connection, the circuit design will meet the timing specification. One example of a delay budgeting technique that may be used is described in Frankle, "Iterative and Adaptive Slack Allocation for Performance-driven Layout and FPGA Routing", 29th *ACM/IEEE Design Automation Conference* (1992). It should be appreciated, however, that any of a variety of different delay budgeting techniques may be used and that the embodiments disclosed within this specification are not intended to be limited by the particular delay budgeting technique employed.

In step 810, the target delays determined through the delay budgeting process can be translated into target lengths. The target length of a connection, e.g., a pin-to-pin connection, can be the maximum Manhattan distance between the two pins that guarantees that the timing of the connection will not exceed the target delay of the connection. The target lengths can be determined through a process such as the one described with reference to FIG. 7. As noted, once such information is calculated, it can be stored and looked up using a table, database, or other data structure when needed in the future. In general, for a connection having a given connection signature, matching test vectors can be located and, of the test vectors matching the connection signature, the largest Manhattan distance can be selected so that all test vectors with a Manhattan distance smaller or equal to this Manhattan distance have a delay that does not exceed the target delay. This Manhattan distance can be used as the target length of the connection.

In step 815, edges and edge weights can be determined using the undirected CFB graph as described with reference to FIGS. 4, 5, and 6 of this specification. In step 820, a target length can be determined for each CFB connection that is composed of more than one connection. The target length of each connection that forms the CFB connection can be summed. The resulting value can be the target length for the CFB connection. In step 825, the CFBs of the circuit design to be placed can be randomly placed, or assigned to sites using some placement technique, upon the programmable IC. In this manner, an initial placement of CFBs can be performed.

In step 830, a cost function can be calculated to determine a cost of the random placement of CFBs on the programmable IC. The value of the cost function indicates a measure of quality of the particular CFB placement for which it is calculated and is indicative of whether the current CFB placement meets timing requirements. Generally, the higher the cost, the less desirable, or lower quality, the CFB placement and the more likely that the CFB placement either consumes too many routing resources or fails to meet one or more timing requirements.

In one embodiment, the cost function can be defined as F, where $$F = \sum_i w_i L_{timing}(e_i).$$

Within this equation, the term $w_i$ represents the edge weight of a given edge $e_i$. The term $L_{timing}(e_i)$ can be defined as $L(e_i)$ when another term, referred to as OverBudget, is calculated to be zero. $L(e_i)$ represents the Manhattan distance between the two CFBs joined by edge $e_i$. When OverBudget is calculated to be greater than zero, $L_{timing}(e_i)$ can be set equal to $L(e_i)(c+ m \cdot \text{Overbudget}(e_i))$. In this expression, the terms c and m each can be constants used to adjust the size of the penalty imposed for an over budget edge according to preference. In one embodiment, $c \geq 0$ and $m \geq 1$. The constant m, for example, may be a scaling factor having a value such as 10.

The term OverBudget($e_i$), e.g., the OverBudget parameter for a given edge $e_i$, can be defined as the maximum OverBudget value for all CFB connections for edge $e_i$. As illustrated with respect to FIGS. 4 and 5, an edge $e_i$ can be formed of, or include, one or more CFB connections.

For any CFB connection that is formed of a single connection, the term OverBudget can be zero when the estimated delay of the connection for the current placement is less than or equal to the target delay of the connection. That is, OverBudget=0, if $d_i \leq d_{target,i}$, where $d_i$ represents the estimated delay of the connection and $d_{target,i}$ represents the target delay of connection. OverBudget can be set to $$\frac{d_i - d_{target,i}}{d_i}, \text{ if } d_i > d_{target,i}.$$

The term OverBudget effectively measures the percentage of the delay of a connection that exceeds what the timing requirements allow. Because the location of each endpoint of the single connection forming edge $e_i$ is known, an estimated delay can be calculated.

For any CFB connection that is formed of a sequence of at least two connections, measures of length can be used in lieu of delays. Such is the case as the location of any intermediate components within the CFB connection of the edge, not yet being placed, is unknown. This means that estimated delays may not be calculated for the CFB connection. Estimated delays of the CFB connection typically are highly dependent upon the location of the as yet unplaced nodes, as these nodes will be located within each such CFB connection.

In one embodiment, the Manhattan distance between two connected CFBs, e.g., the pair of CFBs connected by a given edge, can be used. The Manhattan distance between two CFBs of an edge $e_i$ can be denoted as $l_i$. Accordingly, the term OverBudget can be zero if $l_i \leq l_{target,i}$, where $l_{target,i}$ represents the target length of the CFB connection. The target length $l_{target,i}$ of the CFB connection can be the sum of target lengths determined for each connection that forms the CFB connection. Delays can be converted to lengths as described with reference to FIG. 7. The term OverBudget can be set to $$\frac{l_i - l_{target,i}}{l_i}, \text{ if } l_i > l_{target,i}.$$

In this case, the term OverBudget effectively measures the percentage by which the length, e.g., distance between endpoints, of the CFB connection for the current placement exceeds the target length.

The cost function F can be calculated for the current placement of the CFB components of the circuit design. As an example, consider the case where an edge $e_i$ corresponds to a CFB connection that has an estimated delay that is 20% larger than the target delay or a length that is 20% longer than the target length as determined using the OverBudget term. In this example, the value of the constant c can be set to 5. Accordingly, the contribution of this particular edge $e_i$ to the overall cost of the current placement, denoted as F, using a value of 10 for m, will be $w_i L(e_i) \cdot (5+10 \cdot 0.2) = L(e_i) \cdot (7)$. The 20% overage of either length or delay results in the inclusion of a multiplier of 7 which increases, e.g., penalizes, the cost of this particular edge, e.g., increases the contribution of this edge to the overall cost of the CFB placement.

Accordingly, the overall cost F of the current placement of CFBs can be calculated or determined. As can be seen, the cost function F is a weighted sum of the lengths for edges with penalties being imposed for those edges that represent CFB connections that have either a delay or a length that exceeds the target delay or length, respectively, as the case may be. As noted, for each edge $e_i$, the OverBudget term is the maximum OverBudget term of all CFB connections for the edge $e_i$.

In step 835, an iteration of simulated annealing can be performed upon the current placement of CFBs. In general, simulated annealing refers to an optimization technique that can be used to place components of a programmable IC. The technique explores multi-dimensional solution spaces to find an optimal solution through random generation of new combinatorial configurations. To generate a new placement of CFBs, an old or prior placement can be shuffled at random. For example, the configuration can be shuffled by displacing one or more CFBs to random sites that are available on the programmable IC, by exchanging locations of two or more CFBs, or performing other adjustments to the CFB placement that can affect the cost function. In each iteration, only a limited number of these moves is performed.

After each iteration of annealing, the resulting CFB placement is evaluated using the cost function. The move(s) are accepted or rejected according to whether the cost of the placement after implementation of the move(s) improves as compared to the prior placement. When accepted, the move can be accepted with a probability that depends upon a simulated measure of "temperature."

Simulated annealing was inspired through an analogy with the cooling of metals. As such, the iterative process is regulated by a cooling schedule that dictates this simulated "temperature." The cooling schedule specifies an initial temperature, a final temperature, and a function for changing the temperature as the simulated annealing process continues to iterate. As the temperature decreases, the allowable moves in the annealing process become restricted. Accordingly, the exploration of different CFB placement solutions is emphasized at high temperatures, while the convergence to a particular solution is emphasized at lower temperatures.

Accordingly, in step 840, a cost of the current placement can be calculated using the cost function as described. The cost determined in step 840 is performed after an iteration of simulated annealing performed upon the prior CFB placement in which one or more CFBs has been moved. In step 845, a determination as to whether the cost has improved from the prior placement is made. As noted, an improvement in the cost refers to a reduction in the cost, e.g., a decrease in the value determined using the cost function.

If, in step 845, it is determined that the cost has improved, the method can proceed to step 850, where the current placement of CFBs, e.g., the moves implemented in step 835, can be accepted. If, in step 845, it is determined that the cost has not improved, the method can continue to step 855, where the current placement of CFBs is rejected. That is, the movement of CFBs in the last iteration of simulated annealing can be rejected and the CFB placement can be returned to its state as existed prior to the last iteration of step 835. It should be appreciated that in some simulated annealing techniques, moves may be accepted despite the cost function worsening from a prior annealing iteration. In this respect, the flow chart of FIG. 8 is presented for purposes of illustration only and is not intended to limit the embodiments described within this specification or the particular type of simulated annealing used.

Continuing with step 860, a determination can be made as to whether one or more exit criteria has been met. The annealing process can be terminated when any one or more of a variety of different criteria have been met. For example, the process can be terminated after a predetermined number of iterations. In another example, the process can be terminated when the cost function does not improve, or does not improve by a predetermined amount, within a selected number of iterations or consecutive iterations. In another example, the process can be terminated after a predetermined amount of runtime. In any case, if an exit criterion is met in step 860, the method can proceed to step 865. If no exit criterion is met, the method can proceed to step 835 to continue the annealing process with respect to CFBs.

Continuing with step 865, the CFB placement optionally can be optimized. For example, a greedy optimization technique may be performed upon the CFB placement. A set of CFBs that are connected by edges that violate delay or length targets can be identified. For each CFB in the set, a window, e.g., a rectangle, can be generated that encompasses the current location of each CFB. The size of the window may vary, but for purposes of illustration, may have a length and/or width that is a multiple of the length and/or width respectively of the site for that type of CFB. It should be appreciated that the length and width of the window may be selected independently of one another. Examples of values for the multiple of length and/or width of the window may be 2, 3, 4, 5, etc.

The cost function can be recalculated for various moves of each CFB to different available sites within the window surrounding the CFB. If a site within the window is occupied by another CFB, the two CFBs can be swapped. The move or swap that decreases the cost function the most can be accepted. The use of windows in limiting the number of available moves and the restriction of the optimization to only those CFBs for which timing or length constraints are violated, helps to reduce the amount by which the CFB placement is disturbed during the optimization process.

In step 870, the resulting CFB placement can be output. As used within this specification, "outputting" and/or "output" can mean, for example, writing to a file, writing to a user display or other output device, playing audible notifications, sending or transmitting to another system, exporting, storing in memory, or the like.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

A "computer," e.g., a data processing system or a computer system, suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices such as, for example, keyboards, displays, pointing devices, etc., can be coupled to the computer either directly or through intervening I/O controllers. Network adapters may also be coupled to the computer to enable the computer to become coupled to other computers, devices, or remote printers or storage devices through intervening private or public networks. Modems, cable modems, and Ethernet cards are just a few of the currently available types of network adapters.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of implementing a circuit design within an integrated circuit, the method comprising:
    within an undirected graph representing the circuit design comprising nodes and edges, wherein each node represents a complex function block or a pre-placed component of the circuit design and each edge represents at least one connection linking a pair of complex function blocks of the circuit design forming a complex function block connection, determining an edge weight for each edge;
    initially placing the complex function blocks on the integrated circuit;
    calculating a distance between each pair of complex function blocks joined by an edge of the undirected graph;
    annealing, using a processor, the complex function block placement by minimizing a cost function that calculates, for each edge, a product of the edge weight and the distance between the pair of complex function blocks joined by the edge, and sums the products for each edge, wherein the product for each edge is selectively adjusted according to an over budget term;
    wherein the over budget term is calculated using delay or length according to whether the complex function block connection consists of a single connection or comprises a plurality of connections; and
    storing the complex function block placement.

2. The computer-implemented method of claim 1, wherein for each complex function block connection consisting of one connection, the method further comprises:
    determining whether an estimated delay for the connection exceeds a budgeted delay for the connection; and
    when the estimated delay exceeds the budgeted delay for the connection, calculating the over budget term for the complex function block connection, wherein the over budget term depends upon a percentage by which the estimated delay for the connection exceeds the budgeted delay for the connection.

3. The computer-implemented method of claim 2, wherein for each complex function block connection comprising a plurality of connections, the method further comprises:
    determining a target length for the complex function block connection;
    determining whether a distance between the nodes joined by the complex function block connection exceeds the target length; and
    when the distance between the nodes exceeds the target length for the function block connection, calculating the over budget term for the complex function block connection, wherein the over budget term depends upon a percentage by which the distance between the nodes exceeds the target length.

4. The computer-implemented method of claim 3, wherein for each edge, the method further comprises:
    selecting a maximum one of the over budget terms for the edge; and
    increasing the product for the edge by an amount proportional to the maximum over budget term.

5. The computer-implemented method of claim 3, wherein for each complex function block connection comprising a plurality of connections, the method comprises:
    translating a target delay for each connection of the complex function block connection into a target length; and
    summing the target length of each connection of the complex function block connection to determine a target length for the complex function block connection.

6. The computer-implemented method of claim 5, wherein translating a target delay for each connection into a target length comprises determining a maximum Manhattan distance for a connection that guarantees that the connection will not exceed a target delay for the connection.

7. The computer-implemented method of claim 1, further comprising performing the initial placement of complex function blocks prior to placing look-up tables and flip-flops of the circuit design on the integrated circuit.

8. The computer-implemented method of claim 1, wherein determining a weight for each edge comprises, for each edge consisting of a single complex function block connection:
    determining a net weight for each net connecting the pair of complex function blocks corresponding to the edge;
    selecting the net of the complex function block connection having a minimum net weight; and
    determining an edge weight for the edge by calculating a product of the minimum net weight of the complex function block connection and an inverse of a number of levels in the complex function block connection.

9. The computer-implemented method of claim 1, wherein determining an edge weight for each edge comprises, for each edge comprising a plurality of complex function block connections:
  for each complex function block connection, selecting the net having a minimum net weight;
  for each complex function block connection, determining a product of the minimum net weight of the complex function block connection and an inverse of a number of levels in the complex function block connection; and
  summing the products to derive an edge weight for the edge.

10. A computer-implemented method of implementing a circuit design within an integrated circuit, the method comprising:
  determining an edge weight for each edge of the circuit design, wherein each edge represents at least one connection linking a pair of complex function blocks forming a complex function block connection;
  prior to placing configurable logic blocks and flip-flops of the circuit design, performing an initial placement of the complex function blocks;
  annealing, using a processor, the complex function block placement by minimizing a cost function that calculates, for each edge, a product of the edge weight of the edge and a measure of distance between the pair of complex function blocks joined by the edge, and sums the products;
  for each edge consisting of one connection, during the annealing, selectively applying a penalty by increasing the product for the edge according to estimated delay and budgeted delay of the connection;
  for each edge comprising at least two connections, during the annealing, selectively applying a penalty by increasing the product for the edge according to distance and target length of the connections; and
  storing the complex function block placement.

11. The computer-implemented method of 10, further comprising, for each complex function block connection consisting of one connection:
  determining whether an estimated delay for the complex function block connection exceeds a budgeted delay for the complex function block connection; and
  when the estimated delay exceeds the budgeted delay for the complex function block connection, calculating an over budget term as the penalty, wherein the over budget term depends upon a percentage by which the estimated delay for the complex function block connection exceeds the budgeted delay for the complex function block connection.

12. The computer-implemented method of claim 11, further comprising, for each complex function block connection comprising a plurality of connections:
  determining a target length for the complex function block connection;
  determining whether a distance between the nodes joined by the complex function block connection exceeds the target length; and
  when the distance between the nodes exceeds the target length for the complex function block connection, calculating the over budget term as the penalty, wherein the over budget term depends upon a percentage by which the distance between the nodes exceeds the target length.

13. The computer-implemented method of claim 12, wherein for each edge, selectively applying a penalty comprises:
  selecting a maximum one of the over budget terms for the edge; and
  increasing the product for the edge by an amount proportional to the maximum over budget term.

14. A computer program product comprising:
  a non-transitory computer-usable medium comprising computer-usable program code that implements a circuit design for an integrated circuit, the computer-usable medium comprising:
  computer-usable program code that, within an undirected graph representing the circuit design comprising nodes and edges, wherein each node represents a complex function block or a pre-placed component of the circuit design and each edge represents at least one connection linking a pair of complex function blocks of the circuit design forming a complex function block connection, determines an edge weight for each edge;
  computer-usable program code that initially places the complex function blocks on the integrated circuit;
  computer-usable program code that calculates a distance between each pair of complex function blocks joined by an edge of the undirected graph;
  computer-usable program code that anneals the complex function block placement by minimizing a cost function that calculates, for each edge, a product of the edge weight and the distance between the pair of complex function blocks joined by the edge, and sums the products, wherein the product for each edge is selectively adjusted according to an over budget term;
  wherein the over budget term is calculated using delay or length according to whether the complex function block connection consists of a single connection or comprises a plurality of connections; and
  computer-usable program code that stores the complex function block placement.

15. The computer program product of claim 14, wherein for each complex function block connection consisting of one connection, the computer-usable medium further comprises:
  computer-usable program code that determines whether an estimated delay for the complex function block connection exceeds a budgeted delay for the complex function block connection; and
  computer-usable program code that, when the estimated delay exceeds the budgeted delay for the connection, determines the over budget term for the complex function block connection, wherein the over budget term depends upon a percentage by which the estimated delay for the connection exceeds the budgeted delay for the connection.

16. The computer program product of claim 15, wherein for each complex function block connection comprising a plurality of connections, the computer-usable medium further comprises:
  computer-usable program code that determines a target length for the complex function block connection;
  computer-usable program code that determines whether a distance between the nodes joined by the edge exceeds the target length; and
  computer-usable program code that, when the distance between the nodes exceeds the target length for the function block connection, determines the over budget term for the complex function block connection, wherein the over budget term depends upon a percentage by which the distance between the nodes exceeds the target length.

17. The computer program product of claim 16, wherein for each edge, the computer-usable medium further comprises:
computer-usable program code that selects a maximum one of the over budget terms for the edge; and
computer-usable program code that increases the product for the edge by an amount proportional to the maximum over budget term.

18. The computer program product of claim 17, wherein for each complex function block connection comprising a plurality of connections, the computer-usable medium comprises:
computer-usable program code that translates a target delay for each connection of the complex function block connection into a target length; and
computer-usable program code that sums the target length of each connection of the complex function block connection to determine a target length for the complex function block connection.

19. The computer program product of claim 14, wherein the computer-usable program code that determines a weight for each edge comprises, for each edge consisting of a single complex function block connection:
computer-usable program code that determines a net weight for each net connecting the pair of complex function blocks corresponding to the edge;
computer-usable program code that selects the net of the complex function block connection having a minimum net weight; and
computer-usable program code that determines an edge weight for the edge by calculating a product of the minimum net weight of the complex function block connection and an inverse of a number of levels in the complex function block connection.

20. The computer program product of claim 14, wherein the computer-usable program code that determines an edge weight for each edge comprises, for each edge comprising a plurality of complex function block connections:
computer-usable program code that, for each complex function block connection, selects the net having a minimum net weight;
computer-usable program code that, for each complex function block connection, determines a product of the minimum net weight of the complex function block connection and an inverse of a number of levels of the complex function block connection; and
computer-usable program code that sums the products to derive an edge weight for the edge.

* * * * *